United States Patent
Chen et al.

(10) Patent No.: US 10,804,849 B2
(45) Date of Patent: Oct. 13, 2020

(54) SELF-BIASED AMPLIFIER FOR USE WITH A LOW-POWER CRYSTAL OSCILLATOR

(71) Applicant: UNITED MICROELECTRONICS CORP., Hsin-Chu (TW)

(72) Inventors: Ke-Han Chen, Yunlin County (TW); Min-Chia Wang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 20 days.

(21) Appl. No.: 16/234,593

(22) Filed: Dec. 28, 2018

(65) Prior Publication Data
US 2020/0186086 A1 Jun. 11, 2020

(30) Foreign Application Priority Data

Dec. 6, 2018 (TW) .............................. 107143856 A

(51) Int. Cl.
| | |
|---|---|
| H03F 1/02 | (2006.01) |
| H03B 5/36 | (2006.01) |
| H03F 3/16 | (2006.01) |
| H03F 1/30 | (2006.01) |

(52) U.S. Cl.
CPC ............ *H03B 5/364* (2013.01); *H03F 1/301* (2013.01); *H03F 3/16* (2013.01); *H03B 2200/0038* (2013.01); *H03B 2200/0062* (2013.01); *H03F 2200/267* (2013.01); *H03F 2200/75* (2013.01)

(58) Field of Classification Search
CPC ............ H03B 5/364; H03B 2200/0062; H03B 2200/0038; H03F 1/301; H03F 3/16; H03F 2200/75; H03F 2200/267
USPC .................................. 330/296, 285, 277, 288
See application file for complete search history.

(56) References Cited

U.S. PATENT DOCUMENTS

| | | | | |
|---|---|---|---|---|
| 7,902,923 | B2 | 3/2011 | Li | |
| 9,209,763 | B2* | 12/2015 | Bottarel | H02N 2/181 |
| 2008/0297262 | A1* | 12/2008 | Duster | H03F 1/22 |
| | | | | 330/311 |
| 2015/0061771 | A1* | 3/2015 | Wang | H03K 5/08 |
| | | | | 330/288 |
| 2017/0279423 | A1 | 9/2017 | Ko | |

* cited by examiner

*Primary Examiner* — Khanh V Ngyuen
*Assistant Examiner* — Khiem D Nguyen
(74) *Attorney, Agent, or Firm* — Winston Hsu

(57) ABSTRACT

A self-biased amplifier includes a capacitor, a bias generation circuit and a common source amplifier. The capacitor is used to receive an input voltage and output an alternating component of the input voltage. The bias generation circuit is coupled to the capacitor, and used to generate a first bias voltage according to the alternating component. The common source amplifier is coupled to the bias generation circuit, and used to generate an amplified voltage according to the first bias voltage.

17 Claims, 5 Drawing Sheets

SELF-BIASED AMPLIFIER FOR USE WITH A LOW-POWER CRYSTAL OSCILLATOR

BACKGROUND OF THE INVENTION

1. Field of the Invention

The invention relates to a self-biased amplifier, and specifically, to a self-biased amplifier for use with a low-power crystal oscillator.

2. Description of the Prior Art

Crystal oscillators are often used to generate a clock to ensure synchronization in digital electronic devices. As applications of low-power devices continue to grow, the demand for low-power crystal oscillators increases accordingly. Since a low-power crystal oscillator cannot generate a full-swing square-wave signal but generate a small-swing sinusoidal signal, generation of an accurate clock becomes problematic.

FIG. 1 shows a schematic diagram of a clock generator in the related art. Ideally, the clock generator 1 can generate a square wave to serve as an output clock VOUT. The clock generator 1 comprises a crystal oscillator 10 and a comparator 12. The crystal oscillator 10 comprises a crystal X, an inverter INV, a feedback resistor Rf, and load capacitors C1 and C2. In a low-power environment, a current in the crystal oscillator 10 is suppressed, and consequently, an input signal XIN and an output signal XOUT of the inverter INV are not full-swing square waves but sinusoidal waves. The comparator 12 compares the input signal XIN and the output signal XOUT to generate the output clock VOUT. FIG. 2 shows a signal diagram of the clock generator 1 in FIG. 1, where a vertical axis represents a voltage and a horizontal axis represents a time. An offset is present between signals XIN and XOUT of the inverter INV under a process, voltage, and temperature (PVT) variation. When the offset becomes too large, since there is always a difference present between the signals XIN and XOUT, the comparator 12 cannot generate the output clock VOUT.

Therefore, a clock generator for use in a low-power environment is in need to convert a small-swing and offset output signal of a crystal oscillator into a square-wave clock signal.

SUMMARY OF THE INVENTION

According to one aspect of the invention, a self-biased amplifier including a capacitor, a bias generation circuit and a common source amplifier is provided. The capacitor is used to receive an input voltage and output an alternating component of the input voltage. The bias generation circuit is coupled to the capacitor, and used to generate a first bias voltage according to the alternating component. The common source amplifier is coupled to the bias generation circuit, and used to generate an amplified voltage according to the first bias voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
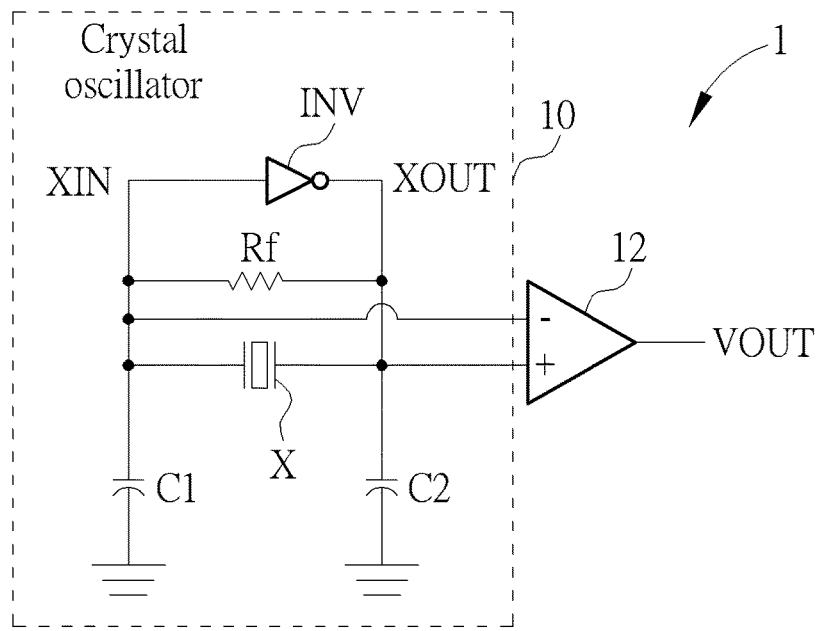
FIG. 1 shows a schematic diagram of a clock generator in the related art.
Figure 2:
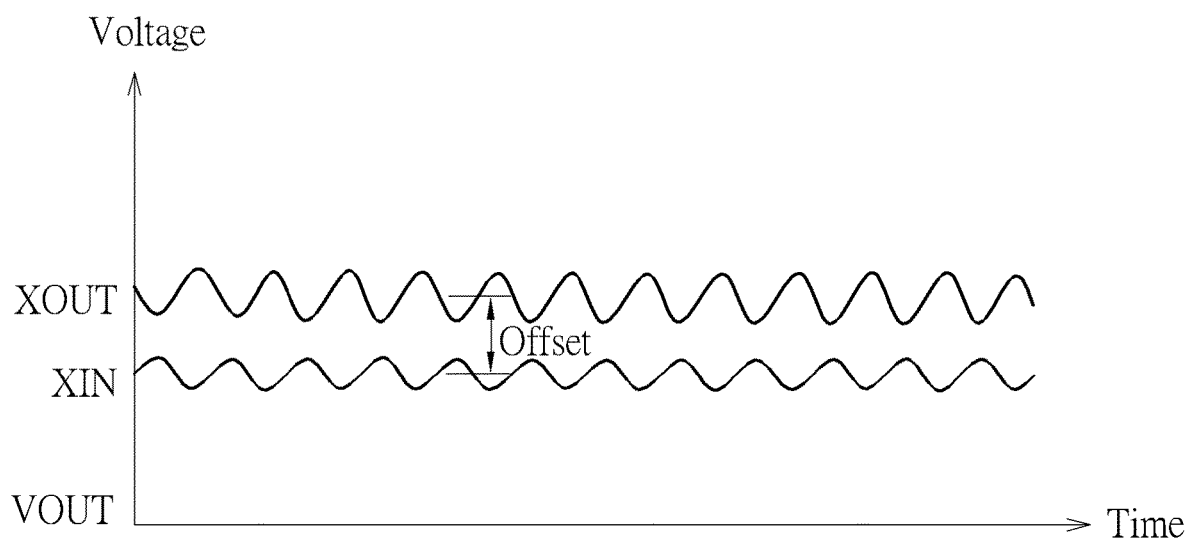
FIG. 2 shows a signal diagram of the clock generator in FIG. 1.
Figure 3:
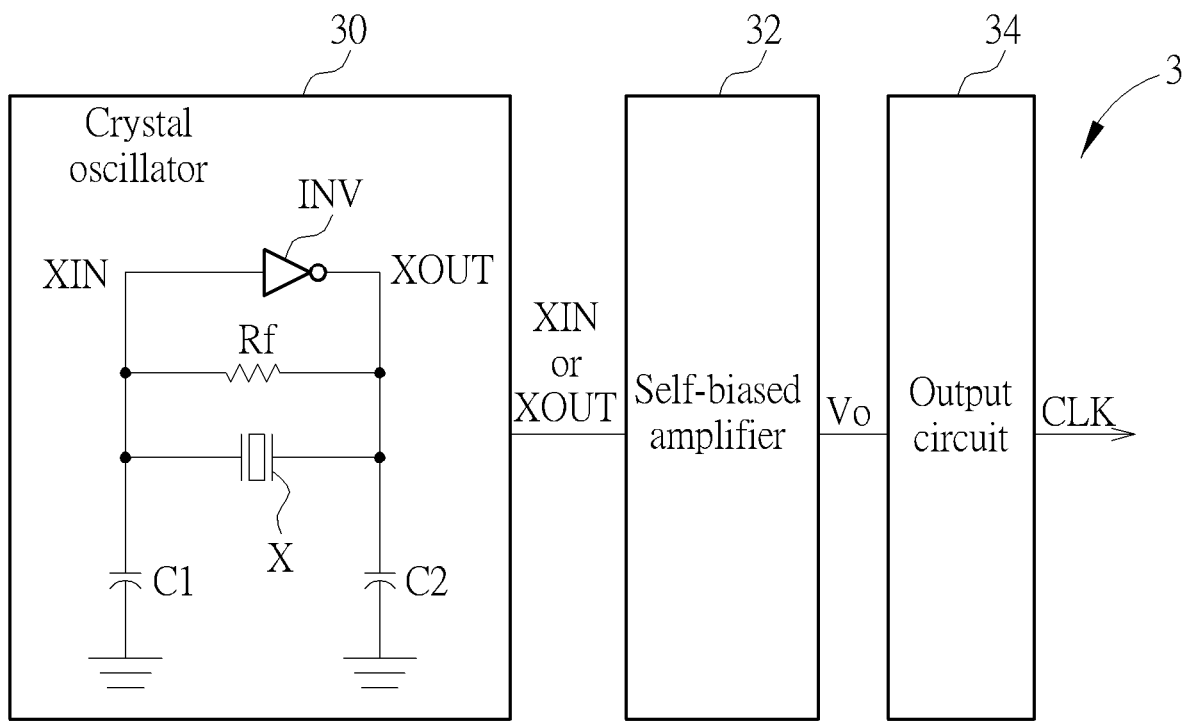
FIG. 3 shows a block diagram of a clock generator according to an embodiment of the invention.

FIG. 3 shows a block diagram of a clock generator 3 according to an embodiment of the invention. The clock generator 3 comprises a low-power crystal oscillator 30, a self-biased amplifier 32 and an output circuit 34. The low-power crystal oscillator 30 is configured to output a partial-swing and offset input signal XIN or output signal XOUT. The self-biased amplifier 32 can amplify the input signal XIN or the output signal XOUT to generate a square-wave output voltage Vo without being affected by the swing range or the offset amount of the input signal XIN or the output signal XOUT. The output circuit 34 is a driving circuit receiving the output voltage Vo to generate a clock signal CLK for use in other circuits.

Figure 4:
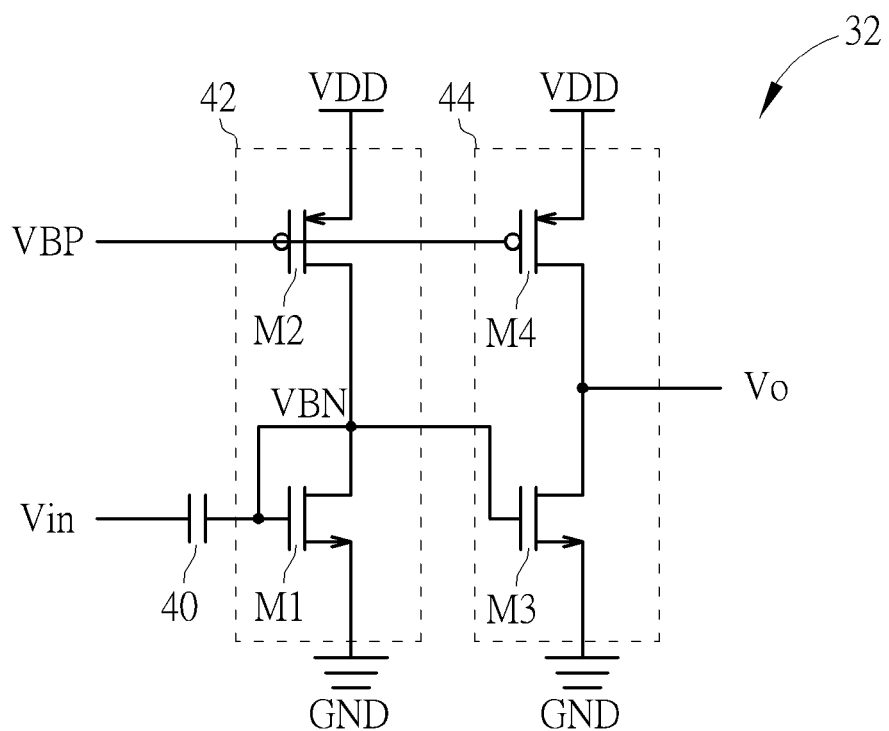
FIG. 4 shows a circuit diagram of an embodiment of the self-biased amplifier in FIG. 3.

FIG. 4 shows a circuit diagram of an embodiment of the self-biased amplifier 32 in FIG. 3. The self-biased amplifier 32 in FIG. 4 comprises a capacitor 40, a bias generation circuit 42 and a common source amplifier 44. The bias generation circuit 42 is coupled to the capacitor 40, and the common source amplifier 44 is coupled to the bias generation circuit 42. The capacitor 40 comprises a first terminal and a second terminal. The bias generation circuit 42 comprises a first transistor M1 and a second transistor M2 coupled thereto. The common source amplifier 44 comprises a third transistor M3 and a fourth transistor M4 coupled thereto. The first transistor M1 and the third transistor M3 may be N-type metal oxide semiconductor field effect transistors (MOSFETs), and the second transistor M2 and the fourth transistor M4 may be P-type MOSFETs. The first transistor M1 and the third transistor M3 may be matched, and the second transistor M2 and the fourth transistor M4 may be matched, thereby reducing an effect of a process, voltage, and temperature (PVT) variation on the self-biased amplifier 32 in FIG. 4. The first transistor M1 and the third transistor M3 may be configured to form a current mirror, and the second transistor M2 and the fourth transistor M4 may be configured to form current sources.

The first terminal of the capacitor 40 is configured to receive the input voltage Vin to filter out a direct current (DC) component of the input voltage Vin to output an alternating component of the input voltage Vin, wherein the input voltage Vin may be the input signal XIN or the output signal XOUT. The first transistor M1 comprises a first terminal coupled to the capacitor 40, a second terminal configured to receive a first reference voltage GND, and a control terminal coupled to the first terminal of the first transistor M1. The second transistor M2 comprises a first terminal configured to receive a second reference voltage VDD, a second terminal coupled to the first terminal of the first transistor M1, and a control terminal configured to receive a second bias voltage VBP. The third transistor M3 comprises a first terminal, a second terminal configured to receive the first reference voltage GND, and a control terminal coupled to the first terminal of the first transistor M1. The fourth transistor M4 comprises a first terminal configured to receive the second reference voltage VDD, a second terminal coupled to the first terminal of the third transistor M3, and a control terminal configured to receive the second bias voltage VBP. The first terminal of the third transistor M3 and the second terminal of the fourth transistor M4 may be configured to output the output voltage Vo of the self-biased amplifier 32. The first reference voltage GND is a ground voltage, and the second reference voltage VDD is a system voltage.

Figure 5:
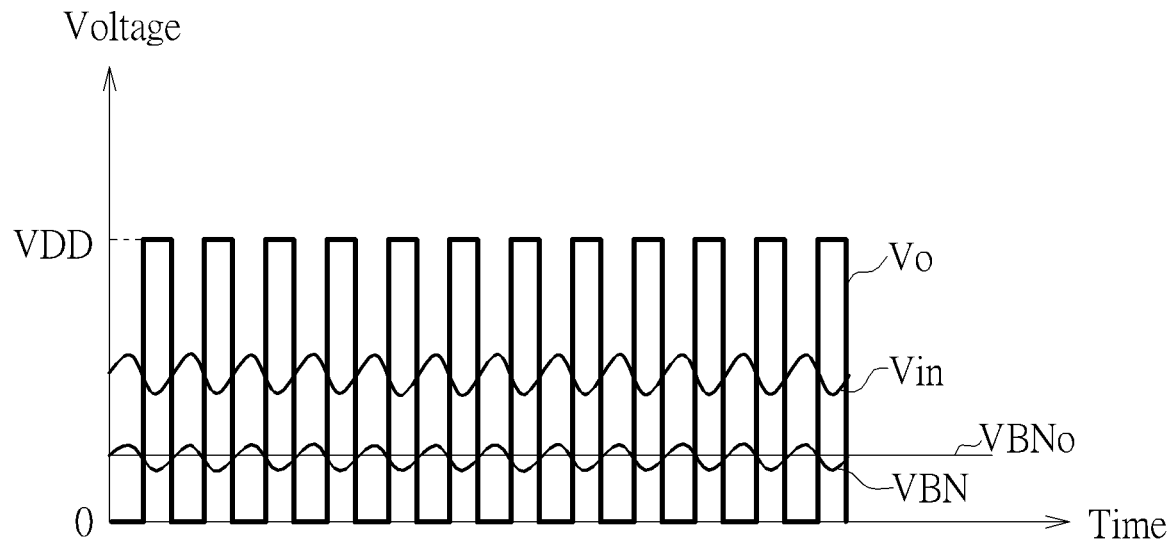
FIG. 5 shows a signal diagram of the self-biased amplifier in FIG. 4.

FIG. 5 is a signal diagram of the self-biased amplifier 32 in FIG. 4, wherein the vertical axis represents a voltage and the horizontal axis represents a time. The input voltage Vin is a sinusoidal signal. The alternating component of the input voltage Vin passes through the capacitor 40 to be transmitted to the control terminal of the first transistor M1, and then is combined with a threshold voltage VBNo of the first transistor M1 and the third transistor M3 to generate a first bias voltage VBN alternating about the threshold voltage level VBNo. When the first bias voltage VBN exceeds the threshold voltage level VBNo, the third transistor M3 is turned on and the fourth transistor M4 is slightly turned on, the output voltage Vo is pulled down to the first reference voltage GND. When the first bias voltage VBN is less than the threshold voltage level VBNo, the third transistor M3 is turned off and the fourth transistor M4 remains slightly turned on, the output voltage Vo is pulled up to the second reference voltage VDD. In this manner, the common source amplifier 44 can amplify the alternating component to generate a full-swing square-wave output voltage Vo. Therefore, the self-biased amplifier 32 in FIG. 4 resolves the issue of offset in the input voltage Vin, reducing the effect of PVT variation on the self-biased amplifier 32, and amplifying a small-swing sinusoidal input voltage Vin to generate the full-swing square-wave output voltage Vo without using a comparator.

Figure 6:
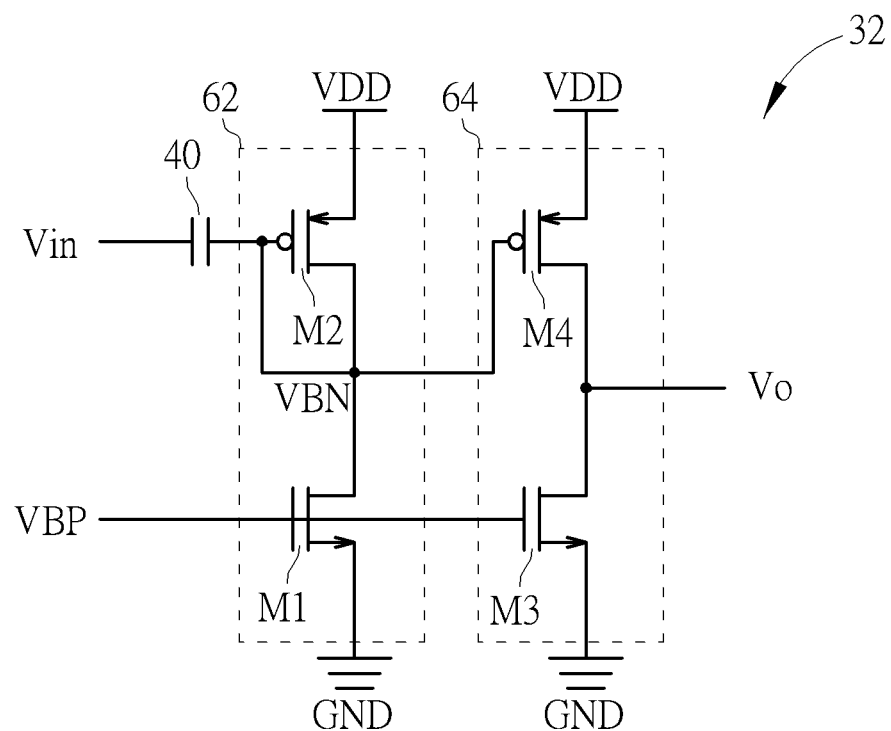
FIG. 6 shows a circuit diagram of another embodiment of the self-biased amplifier in FIG. 3.

FIG. 6 is a circuit diagram of yet another embodiment of the self-biased amplifier 32 in FIG. 3. The self-biased amplifier 32 in FIG. 6 comprises a capacitor 40, a bias generation circuit 62 and a common source amplifier 64. The bias generation circuit 62 is coupled to the capacitor 40, and the common source amplifier 64 is coupled to the bias generation circuit 62. The capacitor 40 comprises a first terminal and a second terminal. The bias generation circuit 62 comprises a first transistor M1 and a second transistor M2 coupled thereto. The common source amplifier 64 comprises a third transistor M3 and a fourth transistor M4 coupled thereto. The first transistor M1 and the third transistor M3 may be N-type MOSFETs, and the second transistor M2 and the fourth transistor M4 may be P-type MOSFETs. The first transistor M1 and the third transistor M3 may be matched, and the second transistor M2 and the fourth transistor M4 may be matched, thereby reducing an effect of a PVT variation on the self-biased amplifier 32 in FIG. 6. The first transistor M1 and the third transistor M3 may be configured to form current sources, and the second transistor M2 and the fourth transistor M4 may be configured to form a current mirror.

The first transistor M1 comprises a first terminal, a second terminal configured to receive a first reference voltage GND, and a control terminal configured to receive a second bias voltage VBP. The second transistor M2 comprises a first terminal configured to receive a second reference voltage VDD, a second terminal coupled to the first terminal of the first transistor M1, and a control terminal coupled to the capacitor 40 and the first terminal of the first transistor M1. The third transistor M3 comprises a first terminal, a second terminal configured to receive the first reference voltage GND, and a control terminal configured to receive the second bias voltage VBP. The fourth transistor M4 comprises a first terminal configured to receive the second reference voltage VDD, a second terminal coupled to the first terminal of the third transistor M3, and a control terminal coupled to the first terminal of the first transistor M1. The first terminal of the third transistor M3 and the second terminal of the fourth transistor M4 may be configured to output the output voltage Vo of the self-biased amplifier 32. The first reference voltage GND is a ground voltage, and the second reference voltage VDD is a system voltage. The circuit configurations and operations of the embodiments in FIG. 6 and FIG. 4 are similar, thus explanation for the embodiment in FIG. 6 is omitted for brevity.

Figure 7:
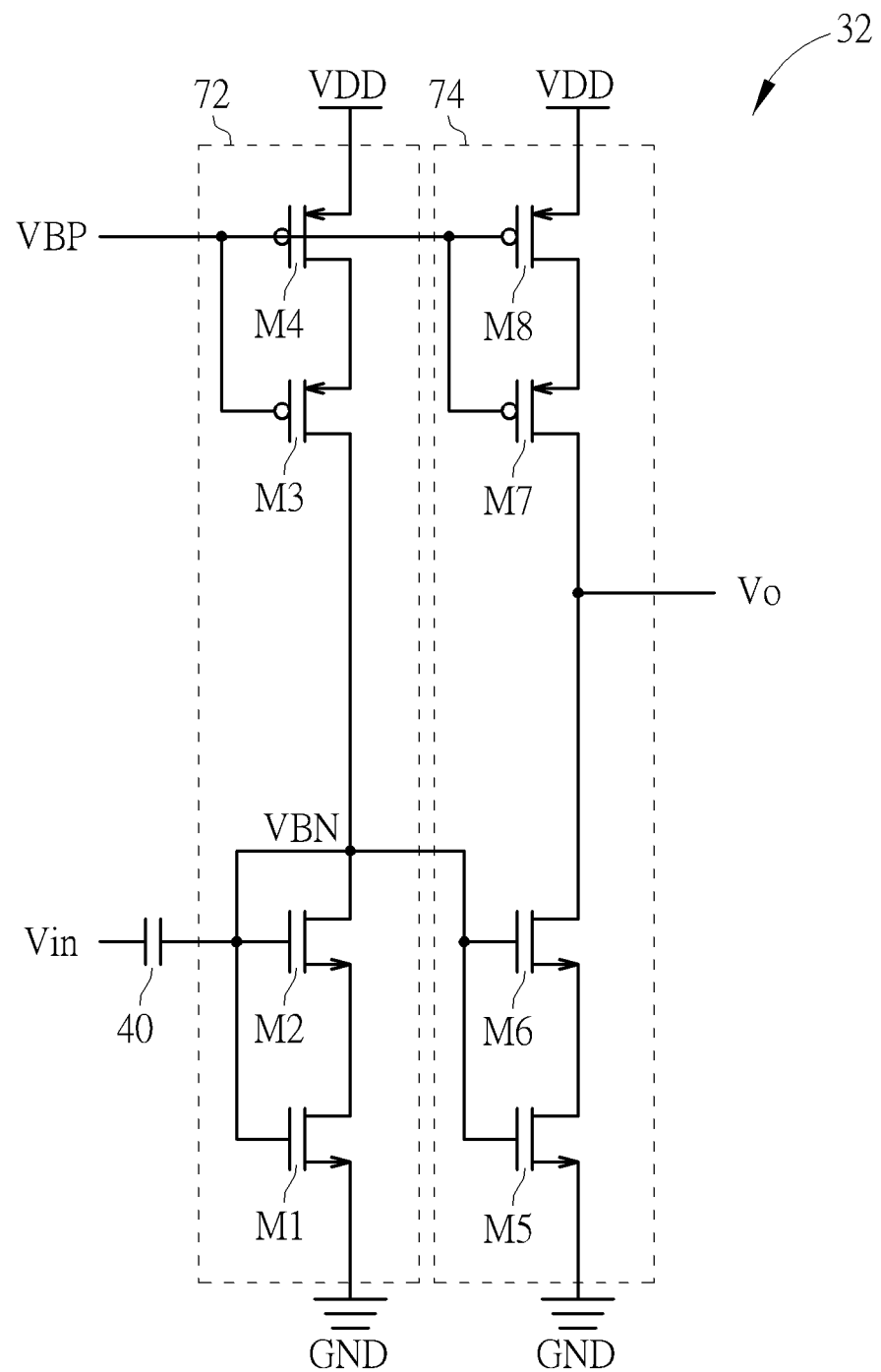
FIG. 7 shows a circuit diagram of yet another embodiment of the self-biased amplifier in FIG. 3.

FIG. 7 is a circuit diagram of yet another embodiment of the self-biased amplifier 32 in FIG. 3. The self-biased amplifier 32 in FIG. 7 comprises a capacitor 40, a bias generation circuit 72 and a common source amplifier 74. The bias generation circuit 72 is coupled to the capacitor 40, and the common source amplifier 74 is coupled to the bias generation circuit 72. The capacitor 40 comprises a first terminal and a second terminal. The bias generation circuit 72 comprises a first transistor M1, a second transistor M2, a third transistor M3 and a fourth transistor M4. The common source amplifier 74 comprises a fifth transistor M5, a sixth transistor M6, a seventh transistor M7 and an eighth transistor M8. The first transistor M1, the second transistor M2, the fifth transistor M5 and the sixth transistor M6 may be N-type MOSFETs, and the third transistor M3, the fourth transistor M4, the seventh transistor M7 and the eighth transistor M8 may be P-type MOSFETs. The first transistor M1, the second transistor M2, the fifth transistor M5 and the sixth transistor M6 may be matched to each other, and the third transistor M3, the fourth transistor M4, the seventh transistor M7 and the eighth transistor M8 may be matched to each other, thereby reducing an effect of a PVT variation on the self-biased amplifier 32 in FIG. 7. The third transistor M3, the fourth transistor M4 may be configured to form a current source, the seventh transistor M7 and the eighth transistor M8 may be configured to form another current source, and the first transistor M1, the second transistor M2, the fifth transistor M5 and the sixth transistor M6 may be configured to form a current mirror.

The first transistor M1 comprises a first terminal, a second terminal configured to receive a first reference voltage GND, and a control terminal coupled to the capacitor. The second transistor M2 comprises a first terminal coupled to the control terminal of the first transistor M1, a second terminal coupled to the first terminal of the first transistor M1, and a control terminal coupled to the control terminal of the first transistor M1. The third transistor M3 comprises a first terminal, a second terminal coupled to the first terminal of the second transistor M2, and a control terminal configured to receive a second bias voltage VBP. The fourth transistor M4 comprises a first terminal configured to receive a second reference voltage VDD, a second terminal coupled to the first terminal of the third transistor M3, and a control terminal configured to receive the second bias voltage VBP. The fifth transistor M5 comprises a first terminal, a second terminal configured to receive the first reference voltage GND, and a control terminal coupled to the first terminal of the second transistor M2. The sixth transistor M6 comprises a first terminal, a second terminal coupled to the first terminal of the fifth transistor M5, and a control terminal coupled to the first terminal of the second transistor M2. The seventh transistor M7 comprises a first terminal, a second terminal coupled to the first terminal of the sixth transistor M6, and a control terminal configured to receive the second bias voltage VBP. The eighth transistor M8 comprises a first terminal configured to receive a second reference voltage VDD, a second terminal coupled to the first terminal of the seventh transistor M7, and a control terminal configured to receive the second bias voltage VBP. The first terminal of the sixth transistor M6 and the second terminal of the seventh transistor M7 may be configured to output the output voltage Vo of the self-biased amplifier 32. The first reference voltage GND is a ground voltage, and the second reference voltage VDD is a system voltage. The signal diagram of the self-biased amplifier 32 in FIG. 7 can be represented by FIG. 5, and explanation therefor is omitted for brevity.

Figure 8:
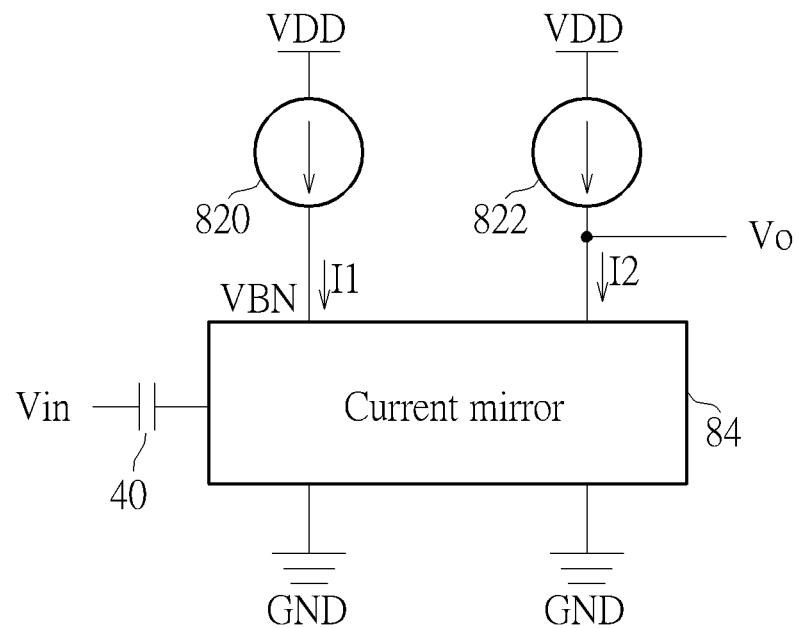
FIG. 8 shows a schematic diagram of the self-biased amplifier in FIG. 4.

FIG. 8 shows a schematic diagram of the self-biased amplifier 32 in FIG. 4, including a capacitor 40, a current mirror 84, a first current source 820 and a second current source 822. The first current source 820 and the second current source 822 may respectively correspond to the second transistor M2 and the fourth transistor M4 in FIG. 4, and may provide substantially identical current I1 and current I2 to the current mirror 84. The current mirror 84 corresponds to the first transistor M1 and the third transistor M3 in FIG. 4. The current mirror 84 receives the input voltage Vin via the capacitor 40, then the current mirror 84 and the first current source 820 operate together to generate a first bias voltage VBN, thereby generating an amplified square wave to serve as the output voltage Vo.

FIG. 8 also shows the schematic diagram of the self-biased amplifier 32 in FIG. 7, including a capacitor 40, a current mirror 84, a first current source 820 and a second current source 822. The first current source 820 may correspond to the third transistor M3 and the fourth transistor M4 in FIG. 7, the second current source 822 may correspond to the seventh transistor M7 and the eighth transistor M8 in FIG. 7, and the first current source 820 and the second current source 822 may provide substantially identical current I1 and current I2 to the current mirror 84. The current mirror 84 may correspond to the first transistor M1, the second transistor M2, the fifth transistor M5 and the sixth transistor M6 in FIG. 7. The current mirror 84 receives the input voltage Vin via the capacitor 40, then the current mirror 84 and the first current source 820 operate together to generate a first bias voltage VBN, thereby generating an amplified square wave to serve as the output voltage Vo.

Figure 9:
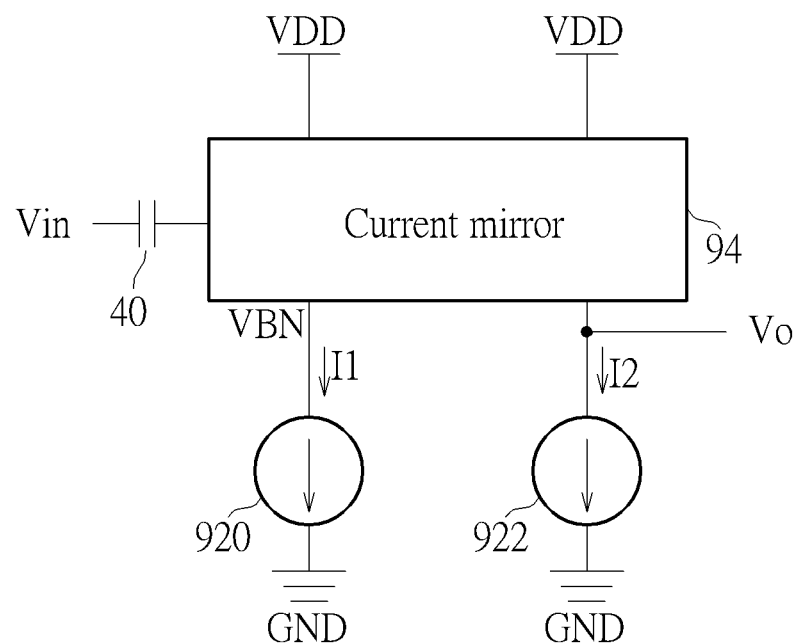
FIG. 9 shows a schematic diagram of the self-biased amplifier in FIG. 6.

FIG. 9 shows a schematic diagram of the self-biased amplifier 32 in FIG. 6, including a capacitor 40, a current mirror 94, a first current source 920 and a second current source 922. The first current source 920 and the second current source 922 may respectively correspond to the first transistor M1 and the third transistor M3 in FIG. 6, and may provide substantially identical current I1 and current I2 to the current mirror 94. The current mirror 94 may correspond to the second transistor M2 and the fourth transistor M4 in FIG. 6. The current mirror 94 receives the input voltage Vin via the capacitor 40, then the current mirror 94 and the first current source 920 operate together to generate a first bias voltage VBN, thereby generating an amplified square wave to serve as the output voltage Vo.

The disclosure is not limited to the circuit configurations in FIG. 4, FIG. 6 and FIG. 7. The capacitor, current sources and current mirror in FIG. 8 and FIG. 9 may be implemented by any circuit configurations capable of providing functions as disclosed herein.

The self-biased amplifiers 32 in FIG. 4, FIG. 6 and FIG. 7 may employ the input signal XIN and the output signal XOUT from the low-power crystal oscillator 30 as the input voltage Vin, amplify the input voltage Vin to generate a square wave to serve as the output voltage Vo without being limited by voltage swings or offsets of the input voltage Vin, without being affected by the PVT variation, and without employing the comparator as in the related art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A self-biased amplifier comprising:
a capacitor, configured to receive an input voltage and output an alternating component of the input voltage;
a bias generation circuit, coupled to the capacitor, configured to generate a first bias voltage, and comprising:
a first transistor comprising:
a first terminal coupled to the capacitor;
a second terminal configured to receive a first reference voltage; and
a control terminal coupled to the first terminal of the first transistor; and
a second transistor comprising:
a first terminal configured to receive a second reference voltage;
a second terminal coupled to the first terminal of the first transistor; and
a control terminal configured to receive a second bias voltage; and
a common source amplifier, coupled to the bias generation circuit, configured to generate an amplified voltage according to the first bias voltage, and comprising:
a third transistor comprising:
a first terminal;
a second terminal configured to receive the first reference voltage; and
a control terminal coupled to the first terminal of the first transistor; and
a fourth transistor comprising:
a first terminal configured to receive the second reference voltage;
a second terminal coupled to the first terminal of the third transistor; and
a control terminal configured to receive the second bias voltage;
wherein the bias generation circuit and the common source amplifier do not have any resistor; and
an output voltage of the self-biased amplifier is sent to an output circuit, which is a driving circuit that generates a clock signal.

2. The self-biased amplifier of claim 1, wherein the first transistor and the third transistor are N-type metal oxide semiconductor field effect transistors (MOSFETs), and the second transistor and the fourth transistor are P-type MOSFETs.

3. The self-biased amplifier of claim 1, wherein the first transistor and the third transistor are matched, and the second transistor and the fourth transistor are matched.

4. The self-biased amplifier of claim 1, wherein the first transistor and the third transistor are configured to form a current mirror, and the second transistor and the fourth transistor are configured to form current sources.

5. The self-biased amplifier of claim 1, wherein the first reference voltage is a ground voltage, and the second reference voltage is a system voltage.

6. A self-biased amplifier comprising:
a capacitor, configured to receive an input voltage and output an alternating component of the input voltage;
a bias generation circuit, coupled to the capacitor, configured to generate a first bias voltage, and comprising:
 a first transistor comprising:
  a first terminal;
  a second terminal configured to receive a first reference voltage; and
  a control terminal configured to receive a second bias voltage; and
 a second transistor comprising:
  a first terminal configured to receive a second reference voltage;
  a second terminal coupled to the first terminal of the first transistor; and
  a control terminal coupled to the capacitor and the first terminal of the first transistor; and
a common source amplifier, coupled to the bias generation circuit, configured to generate an amplified voltage according to the first bias voltage, and comprising:
 a third transistor comprising:
  a first terminal;
  a second terminal configured to receive the first reference voltage; and
  a control terminal configured to receive the second bias voltage; and
 a fourth transistor comprising:
  a first terminal configured to receive the second reference voltage;
  a second terminal coupled to the first terminal of the third transistor; and
  a control terminal coupled to the first terminal of the first transistor;
wherein the bias generation circuit and the common source amplifier do not have any resistor; and
an output voltage of the self-biased amplifier is sent to an output circuit, which is a driving circuit that generates a clock signal.

7. The self-biased amplifier of claim 6, wherein the first transistor and the third transistor are matched, and the second transistor and the fourth transistor are matched.

8. The self-biased amplifier of claim 6, wherein the first transistor and the third transistor are N-type MOSFETs, and the second transistor and the fourth transistor are P-type MOSFETs.

9. The self-biased amplifier of claim 6, wherein the first transistor and the third transistor are configured to form current sources, and the second transistor and the fourth transistor are configured to form a current mirror.

10. The self-biased amplifier of claim 6, wherein the first reference voltage is a ground voltage, and the second reference voltage is a system voltage.

11. A self-biased amplifier comprising:
a capacitor, configured to receive an input voltage and output an alternating component of the input voltage;
a bias generation circuit, coupled to the capacitor, configured to generate a first bias voltage, and comprising:
 the bias voltage generation circuit comprises:
  a first transistor comprising:
   a first terminal;
   a second terminal configured to receive a first reference voltage; and
   a control terminal coupled to the capacitor;
  a second transistor comprising:
   a first terminal coupled to the control terminal of the first transistor;
   a second terminal coupled to the first terminal of the first transistor; and
   a control terminal coupled to the control terminal of the first transistor;
  a third transistor comprising:
   a first terminal;
   a second terminal coupled to the first terminal of the second transistor; and
   a control terminal configured to receive a second bias voltage; and
  a fourth transistor comprising:
   a first terminal configured to receive a second reference voltage;
   a second terminal coupled to the first terminal of the third transistor; and
   a control terminal configured to receive the second bias voltage; and
a common source amplifier, coupled to the bias generation circuit, configured to generate an amplified voltage according to the first bias voltage, and comprising:
 a fifth transistor comprising:
  a first terminal;
  a second terminal configured to receive the first reference voltage; and
  a control terminal coupled to the first terminal of the second transistor;
 a sixth transistor comprising:
  a first terminal;
  a second terminal coupled to the first terminal of the fifth transistor; and
  a control terminal coupled to the first terminal of the second transistor;
 a seventh transistor comprising:
  a first terminal;
  a second terminal coupled to the first terminal of the sixth transistor; and
  a control terminal configured to receive the second bias voltage; and
 an eighth transistor comprising:
  a first terminal configured to receive the second reference voltage;
  a second terminal coupled to the first terminal of the seventh transistor; and
  a control terminal configured to receive the second bias voltage.

12. The self-biased amplifier of claim 11, wherein the first transistor, the second transistor, the fifth transistor and the sixth transistor are N-type MOSFETs, and the third transistor, the fourth transistor, the seventh transistor and the eighth transistor are P-type MOSFETs.

13. The self-biased amplifier of claim 11, wherein the first transistor, the second transistor, the fifth transistor and the sixth transistor are matched, and the third transistor, the fourth transistor, the seventh transistor and the eighth transistor are matched.

14. The self-biased amplifier of claim 11, wherein the first reference voltage is a ground voltage, and the second reference voltage is a system voltage.

15. The self-biased amplifier of claim 11, wherein the self-biased amplifier belongs to a clock generator, which has a low-powered crystal oscillator and the output circuit, and adapted for amplifying the input voltage of a small-swing sinusoidal form to the output voltage of a full-swing square-wave form, which in turn is converted to the clock signal for the clock generator.

16. The self-biased amplifier of claim 6, wherein the self-biased amplifier belongs to a clock generator, which has a low-powered crystal oscillator and the output circuit, and adapted for amplifying the input voltage of a small-swing sinusoidal form to the output voltage of a full-swing square-wave form, which in turn is converted to the clock signal for the clock generator.

17. The self-biased amplifier of claim 1, wherein the self-biased amplifier belongs to a clock generator, which has a low-powered crystal oscillator and the output circuit, and adapted for amplifying the input voltage of a small-swing sinusoidal form to the output voltage of a full-swing square-wave form, which in turn is converted to the clock signal for the clock generator.

\* \* \* \* \*